United States Patent [19]

Thomas et al.

[11] Patent Number: 5,704,983
[45] Date of Patent: Jan. 6, 1998

[54] METHODS AND APPARATUS FOR DEPOSITING BARRIER COATINGS

[75] Inventors: H. Ronald Thomas, Easton; Robert J Babacz, Bethlehem; Robert R. Newton, Nazareth, all of Pa.

[73] Assignee: Polar Materials Inc., Martins Creek, Pa.

[21] Appl. No.: 758,764

[22] Filed: Dec. 19, 1996

Related U.S. Application Data

[60] Continuation of Ser. No. 342,718, Nov. 21, 1994, abandoned, which is a division of Ser. No. 196,896, Feb. 15, 1994, Pat. No. 5,378,510, which is a continuation of Ser. No. 889,637, May 28, 1992, abandoned.

[51] Int. Cl.⁶ .................................................. C23C 16/00
[52] U.S. Cl. ............................... 118/723 MP; 118/723 MW
[58] Field of Search ..................... 118/723 R, 723 MP, 118/723 FE, 723 FI, 723 E, 723 ER, 723 IR, 723 MN; 156/345; 204/298.07, 298.33

[56] References Cited

U.S. PATENT DOCUMENTS

| | | | |
|---|---|---|---|
| 3,442,686 | 5/1969 | Jones | 427/38 |
| 3,856,172 | 12/1974 | Walles | 215/364 |
| 4,478,874 | 10/1984 | Hahn | 427/40 |
| 4,552,791 | 11/1985 | Hahn | 428/35 |
| 4,667,620 | 5/1987 | White | 118/50.1 |
| 4,673,586 | 6/1987 | White | 427/38 |
| 4,684,553 | 8/1987 | Sasaki et al. | 428/35 |
| 4,717,586 | 1/1988 | Ishihara et al. | 427/39 |
| 4,764,405 | 8/1988 | Bauman et al. | 428/35 |
| 4,853,250 | 8/1989 | Boulos et al. | 118/723 IR |
| 4,880,675 | 11/1989 | Mehta | 428/35.7 |
| 4,883,686 | 11/1989 | Doehler et al. | 427/38 |
| 4,888,199 | 12/1989 | Felts et al. | 427/10 |
| 4,918,031 | 4/1990 | Flamm et al. | 437/225 |
| 5,085,904 | 2/1992 | Deak et al. | 428/35.7 |
| 5,180,435 | 1/1993 | Markunas et al. | 118/723 |
| 5,356,673 | 10/1994 | Schmitt et al. | 427/446 |
| 5,389,153 | 2/1995 | Paranjpe et al. | 118/723 MP |
| 5,424,103 | 6/1995 | Ahn | 427/569 |
| 5,522,343 | 6/1996 | Kodama et al. | 118/723 MP |

FOREIGN PATENT DOCUMENTS

| | | |
|---|---|---|
| 113555 | 8/1987 | European Pat. Off. . |
| 299754 | 1/1989 | European Pat. Off. . |
| 0 422 243 A1 | 3/1990 | European Pat. Off. . |
| 469926 | 2/1992 | European Pat. Off. . |
| 361091377 | 5/1986 | Japan ............... 118/723 IR |
| 361174376 | 8/1986 | Japan ............... 118/723 IR |
| 2247375 | 10/1990 | Japan ............... 118/723 IR |
| 404198089 | 7/1992 | Japan ............... 118/723 IR |

OTHER PUBLICATIONS

Plein, P. and Menges, G., Plasmapolymerization as Coating Process for Plastic and Metallic Parts, Antec '88, pp. 1538–1541.

*Primary Examiner*—John Niebling
*Assistant Examiner*—Joni Y. Chang
*Attorney, Agent, or Firm*—Lerner, David, Littenberg, Krumholz & Mentlik

[57] ABSTRACT

A barrier coating is formed on a polymeric article, such as on the interior of a thermoplastic container. An oxidizing gas is converted to a plasma in a plasma chamber remote from the treatment chamber. The resulting plasma-activated oxidizing species are delivered to the interior of the container. An organosilicon reactant vapor is separately but simultaneously delivered to the interior of the container so that the organosilicon vapor and oxidizing active species mix within the container. An electric qfield is also applied to the container, so that the reaction products are deposited under the influence of the electrical field to form the barrier coating.

5 Claims, 2 Drawing Sheets

METHODS AND APPARATUS FOR DEPOSITING BARRIER COATINGS

This is a continuation of application Ser. No. 08/342,718 filed Nov. 21, 1994, abandoned which is a Divisional of application Ser. No. 08/196,896, filed on Feb. 15, 1994, U.S. Pat. No. 5,378,510, which is a continuation of application Ser. No. 07/889,637, filed on May 28, 1992, abandoned.

FIELD OF THE INVENTION

The present invention relates to apparatus and methods for depositing barrier coatings on polymeric substrates such as films and containers.

BACKGROUND OF THE INVENTION

Containers for chemically sensitive materials such as food products traditionally have been made from inorganic materials such as glass. Glass containers are transparent and permit the consumer to view the product before purchasing it. Moreover, glass containers are essentially impermeable to atmospheric gases such as oxygen and hence protect the product. However, glass containers are expensive, heavy and susceptible to breakage. Accordingly, considerable effort has been devoted to development of containers made from polymeric materials such as thermoplastics. Thermoplastic containers can be made inexpensively. They are light in weight and hence inexpensive to ship. They are resistant to breakage and can be fabricated in convenient shapes.

However, polymeric containers ordinarily are permeable to atmospheric gases and to gases in the packaged product. This drawback has limited use of polymeric containers in many applications. Various approaches have been taken towards eliminating the permeability of polymeric containers. Certain polymers have relatively low permeability to particular gases. Containers fabricated from these polymers sometimes can provide satisfactory resistance to permeation for particular applications. However, use of these particular, low permeability polymers can introduce additional problems of cost, transparency, or strength. In certain cases, the low permeability polymers are incompatible with the product to be contained. To alleviate these drawbacks composite containers incorporating one or more layers of a low permeability polymer in conjunction with layers of other polymers have been used. This approach is costly and can make it more difficult to recycle the containers using common recycling techniques such as melt processing.

Various proposals have been advanced for rendering polymeric materials less permeable to oxygen and other gases by depositing thin films incorporating inorganic materials such as oxides of silicon on a substrate consisting of the polymeric material.

Jones, U.S. Pat. No. 3,442,686, notes that pure $SiO_2$ films or other pure inorganic oxide films deposited by direct vacuum evaporation onto polymeric films form useful oxygen barriers.

White, U.S. Pat. No. 4,667,620, discloses coating of a bottle utilizing direct vaporization and ionization of a metal such as aluminum in an oxidizing atmosphere adjacent the items to be treated. DC and RF biasing is used to accelerate the ions so as to deposit aluminum oxide on the inner surface of the preform or bottle. The reference contemplates deposition of other oxides such as "SiO". White '620 suggests that the coating should be located on the interior of the bottle to better protect the coating and preserve its integrity as an oxygen barrier.

Hahn, U.S. Pat. No. 4,478,874, discloses a generally similar process, except that the same is used to coat the exterior of a bottle. At col. 2, ln. 68-col. 3, ln. 2, the reference notes the possibility of rotating a bottle about its axis to obtain a more even coating.

Felts et al., U.S. Pat. No. 4,888,199, is directed generally to control of plasma processes, but nonetheless discloses a plasma-enhanced chemical vapor deposition process in which a substrate, such as a "metal, glass some plastics and coated substrates" (col. 3, lns. 58–59) is disposed within a plasma of an organosilicon such as hexamethyldisiloxane with oxygen and helium. The reference thus contemplates a direct plasma process, wherein the only plasma in the system is that formed in the immediate vicinity of the substrate. The resulting coating is said to be hard and scratch-resistant.

European Patent Application No. 0,299,754 discloses a direct plasma deposition process generally similar to Felts '199, with specific use of an inert gas, an organosilicon and an oxygen component in the plasma. Among the substrates which can be coated are "various plastics such as polycarbonate resins, useful for packaging foods or beverages", the coating being said to "prevent oxygen or moisture permeation."Example III at pp. 7–8 refers to deposition of coatings having low oxygen permeation and notes that a gas stream incorporating tetramethyldisiloxane or "TMDSO" together with oxygen and helium is useful for that purpose in the direct plasma process.

Plein et al., Plasmapolymerization as Coating Process for Plastic and Metallic Parts (ANTEC, 1988 pp. 1538–1541) describes internal coating of plastic bottles by a direct plasma "polymerization" of hexamethyldisiloxane (HMDSO). HMDSO vapor is introduced through a "monomer inlet" inserted through the mouth of the bottle being coated, the bottle being arranged for rotation during the coating process. The plasma is formed within the bottle itself. This reference states explicitly that the coating formed "does not inhibit the diffusion of oxygen but increases it, depending on the selected substrate", i.e., that the resulting coating is useless as an oxygen diffusion barrier on the bottle.

Despite these and other substantial efforts in the art, thin film coatings incorporating inorganic materials such as oxides have not been widely adopted heretofore in the packaging industry. Each of the processes noted above for making such coatings imposes substantial limitations and drawbacks. Thus, there has been a considerable need for improved processes for coating polymeric articles, and particularly the interiors of polymeric containers with barrier coatings. There have been corresponding needs for improved apparatus for performing the process, and for containers having improved coatings.

SUMMARY OF THE INVENTION

One aspect of the present invention provides methods of forming barrier coatings on polymeric articles. A method according to this aspect of the invention preferably includes the steps of passing an oxidizing gas through a plasma zone in a downstream direction towards the article and converting the oxidizing gas to a plasma in the plasma zone. In the plasma zone, the oxidizing gas is converted to oxidant ions such as oxygen-bearing ions which react to yield principally neutral, non-ionic, but nonetheless highly reactive oxidant species such as monatomic oxygen, ozone, NO radicals and the like. The plasma thus forms activated species which pass downstream from the plasma zone. Activated species formed from such plasmas are also referred to as "afterglow" species. The method further includes the steps of delivering these activated species to the vicinity of the article to be treated and delivering an organosilicon vapor to the vicinity of the article separately from the activated species. The organosilicon vapor and the activated species are mixed in proximity to the article while maintaining the mixed activated species and organosilicon vapor under subatmospheric pressure and applying an electrical potential to these mixed species in proximity to the article. These steps are performed so that the reaction products formed from the mixed organosilicon vapor and activated species are deposited on the article under the influence of the electrical potential and form an essentially impervious coating.

Because the organosilicon vapor is delivered separately from the activated species to the vicinity of the article, the organosilicon is not converted into a plasma along with the oxidizing gas in the plasma zone. Although the present invention is not limited by any theory of operation, it is believed that the principal reactions occur between the organosilicon vapors and non-ionic, but nonetheless reactive oxidant species. The reactions yield organic residues as a by-product along with inorganic compounds such as silicon oxides. The inorganic compounds are deposited on the article as a coating. The coating formed from the reaction products typically includes minor amounts of organic residues derived from the organosilicon compound. Such organic residues have been considered heretofore as indicating an imperfect silicious coating and have been considered as undesirable. According to the present invention, however, it has been found that coatings incorporating appreciable amounts of organic residues formed by processes according to the invention nonetheless provide excellent barrier properties. The preferred coatings according to the invention can provide substantial resistance to permeation of gaseous or volatile substances such as oxygen, carbon dioxide, water vapor, hydrocarbons and flavorants.

In particularly preferred methods according to this aspect of the invention, the polymeric article is hollow, and may be a hollow container such as a bottle. The steps of delivering the activated species and the organosilicon vapor are conducted so as to deliver the activated species and vapor separately to the interior of the hollow article, so that the activated species and vapor mix within the interior of the hollow article and reaction products are deposited on the interior of the hollow article, thereby forming the coating on the interior surface of the article. The hollow article may be rotated about an axis and the activated species and vapor may be delivered through outlet conduits extending into the hollow article adjacent the axis. In the case of a hollow bottle, the outlet conduits may extend into the interior of the bottle through the mouth of the bottle. The article may also be reciprocated relative to the outlet conduits in directions generally parallel to the axis as the activated species and vapor are delivered. Both of these steps promote even distribution of the coating on the interior surface. Alternatively or additionally, rotational flow of the activated species and vapors within the hollow article maybe induced in other ways, such as by discharging the activated species and vapors in a generally tangential direction, adjacent the peripheral wall of the article so as to induce a swirling flow about the central axis. Effective mixing and hence reaction between the vapors and activated species may be promoted by discharging the organosilicon vapor and the activated species as streams in proximity to the article so that one of the streams substantially surrounds the other one of the streams. For example, the activated species may be discharged through a generally annular orifice and the organosilicon vapors may be discharged from an orifice at the center of the annular orifice.

Most preferably, the step of applying an electrical potential in proximity to the article is conducted so as to apply the potential through the polymeric article itself. Typically, an alternating potential having a frequency between about 1 KHz and about 100 MHz, and more preferably between about 100 KHz and about 20 MHz is applied to an electrically conductive element while at least a portion of the polymeric article is disposed between the electrically conductive element and the mixed vapors and activated species. In a particularly preferred arrangement, a hollow article such as a bottle is disposed within a closely fitting, electrically conductive shell, the organosilicon vapors and activated species are introduced into the interior of the hollow article and the electrical potential is applied to the shell.

Further aspects of the invention include apparatus for treating hollow articles. Apparatus according to this aspect of the invention preferably includes a treatment chamber and means for retaining a hollow article at a treatment location within the treatment chamber. The apparatus also includes means for converting a first gas, such as an oxidizing gas, to a plasma in a plasma zone remote from the treatment location so that the plasma forms activated gas species and means for delivering these activated species to the interior of the hollow article. The plasma zone may be outside of the treatment chamber or inside the treatment chamber but remote from the treatment zone. The apparatus according to this aspect of the invention preferably also includes means for delivering a second gas reactive with the activated species, such as an organosilicon vapor, to the interior of the article separately from the activated species but simultaneously therewith so that the second gas mixes with the activated species in the interior of the article, whereby the interior of the article is exposed to the products of reaction between the second gas and the activated species. Preferably, the means for retaining the hollow article includes an electrically conductive shell arranged to envelop the exterior of the article and the apparatus also includes means for applying an electrical potential such as an alternating electrical potential to the shell.

Further aspects of the invention include gas supply apparatus which can be used in apparatus and processes as discussed above. Gas supply apparatus according to this aspect of the invention incorporates a plasma chamber defining an interior space and preferably also includes first gas inlet means for supplying a first gas to the interior space of the chamber and plasma conversion means for converting the first gas to a plasma in the interior space so as to form plasma activated species. Second gas supply means are provided for supplying a second gas. The apparatus also incorporates means defining an activated species outlet orifice communicating with the interior space of the plasma chamber for delivering the plasma activated species and a second gas outlet orifice connected to the second gas supply means. One of these outlet orifices surrounds the other. Thus, the activated species and the second gas can be discharged in generally concentric streams, one such stream surrounding the other. This promotes intimate mixing and reaction of the second gas and the activated species. The apparatus preferably includes a conduit for delivering the second gas, the conduit defining the second gas outlet orifice at its downstream end. Desirably, the conduit extends through the plasma chamber but does not communicate with the interior space within the plasma chamber. The activated species outlet orifice may be defined by a tube extending from the plasma chamber to a downstream end remote from the plasma chamber, the activated species outlet orifice being disposed at the downstream end of the tube. The downstream end of the conduit preferably extends coaxially within the tube. Thus, both the second gas and the plasma activated species are discharged at the downstream end of the tube.

In operation of this apparatus, the first gas is converted to a plasma. Although the conduit extends through the plasma chamber, the second gas does not mix with the plasma within the chamber and is not converted into a plasma. The second gas is discharged essentially unaltered at the downstream end of the conduit for reaction with the plasma activated species. Preferably, the means for converting gas within the plasma chamber to a plasma includes means such as a coil for applying electric fields to the first gas. At least that portion of the conduit extending through the plasma chamber desirably has a relatively small interior diameter, preferably about 10 millimeters or less. The relatively small diameter of the conduit tends to repress formation of plasma from the second gas passing through the conduit.

Gas supply apparatus according to this aspect of the present invention thus provide a simple way to deliver both plasma activated species and a gas which has not been converted to a plasma in close proximity to one another and in a desired location within treatment apparatus, such as into the interior of a hollow article.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Apparatus according to one embodiment of the invention includes an electrically grounded treatment chamber 10 formed from a conductive material such as metal or a nonconductive material such as glass with separate grounding features (not shown). Chamber 10 has appropriate feedthroughs and openings (not shown) for inserting articles to be treated and removing the articles from the chamber. The interior of chamber 10 is connected to a vacuum pump 12 via an exhaust conduit 14. A pressure sensor 16 is arranged to detect the pressure within the chamber and to provide a signal representing that pressure to a display device 18 and to a feedback controller 20. Controller 20 in turn is arranged to actuate a throttling valve 22 connected between exhaust conduit 14 and vacuum pump 12 so as to maintain a controlled, sub-atmospheric pressure within chamber 10.

Figure 1:
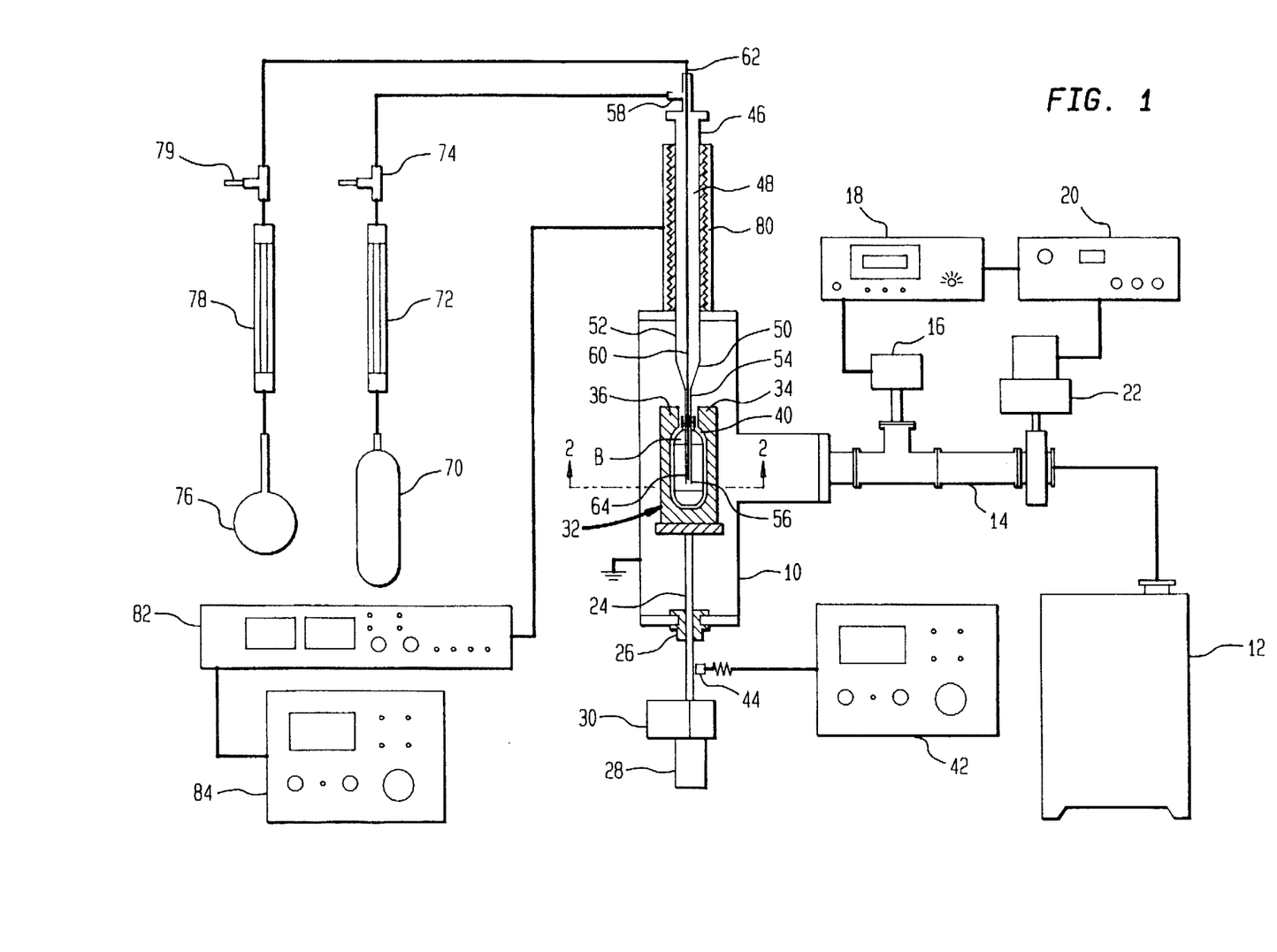
FIG. 1 is a diagrammatic, partially sectional view of apparatus according to one embodiment of the invention.
Figure 2:
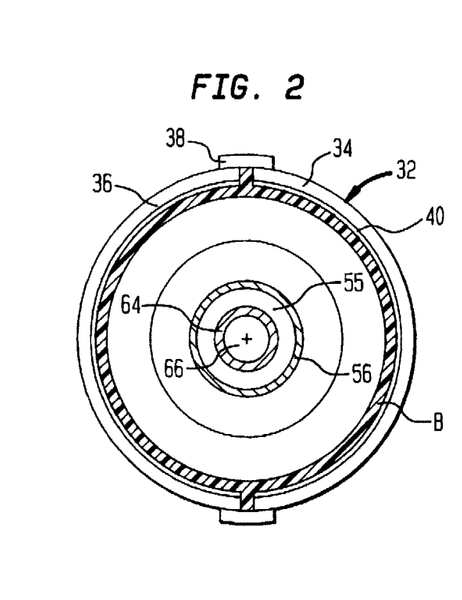
FIG. 2 is a sectional view on an enlarged scale taken along lines 2—2 in FIG. 1.

A shaft 24 is rotatably and slidably mounted to the wall of chamber 10 by a feed through and bearing assembly 26 arranged to permit the shaft to rotate about its axis and to slide longitudinally along its axis, and also arranged to provide a seal around the shaft. Shaft 24 is formed from a metallic or other electrically conductive material. Feed through assembly 26 electrically insulates shaft 24 from the wall of chamber 10. The end of the shaft disposed outside of the chamber is connected to a rotation drive motor 28 and to a linear actuator 30. These components are arranged to rotate the shaft about its axis and to reciprocate the shaft along its axis, upwardly and downwardly as seen in FIG. 1. A metallic, electrically conductive shell 32 is mounted on the end of the shaft disposed within chamber 10. As best seen in FIG. 2, shell 32 includes two mating halves 34 and 36 and a clasp 38 arranged to hold the two mating halves in engagement with one another. Halves 34 and 36 of the shell cooperatively define an interior space 40 arranged to closely receive a container to be treated and an opening 37 at the end of such interior space remote from shaft 24. Space 40 has substantially the same shape as the container to be treated and the interior dimensions of space 40 are just slightly larger than the exterior dimensions of the container. Clasps 38 (FIG. 2) can be actuated to release the halves from one another to permit loading and unloading of containers. Both halves 36 and 34 of the shell are electrically connected to one another and to shaft 24.

An alternating potential power supply 42 is electrically connected to shaft 24, and hence to both halves of shell 32 via a brush assembly 44 disposed outside of chamber 10. Brush assembly 44 may incorporate conventional components such as one or more electrical contacts and springs to maintain the electrical contact or contacts in engagement with the surface of the shaft as the shaft rotates and reciprocates.

A tubular plasma chamber 46 defining an interior space 48 is mounted outside of chamber 10 and has a downstream extension 52 protruding into chamber 10. The downstream extension 52 of chamber 46 merges with a generally conical adapter 50, which in turn merges with an elongated tube 54 having an outlet orifice 55 (FIG. 2) at its downstream end 56, remote from plasma chamber 46. Preferably, chamber 46, downstream extension 52, adaptor 50 and tube 54 are all formed from a chemically resistant dielectric material such as quartz or glass. These elements may be formed integrally with one another. Chamber 46 has an inlet port 58 at its upstream end. A conduit 60 formed from small diameter tubing commonly referred to as "capillary tubing" extends coaxially through chamber 46. The tubing constituting conduit 60 may be formed from the some materials as chamber 46. Conduit 60 has an upstream end 62 disposed outside of chamber 10 and outside of chamber 46. The downstream end 64 of conduit 60 extends generally coaxially within tube 54. Conduit 60 defines an outlet orifice 66 (FIG. 2 ) at its downstream end. As shown in FIG. 2, the downstream end 64 of the conduit is disposed within the orifice 55 defined by the downstream end 56 of tube 54. Thus, the outlet orifice 66 of conduit 60 is disposed within the annular outlet orifice 55 defined by tube 54. The coaxial conduit 60 and tube 54 extend generally co-axially with shaft 24 and extend into the interior space 40 of shell 32 through the end opening 37 of the shell.

An oxidizing gas source 70 such as a tank containing the desired oxidizing gas and equipped with a conventional pressure regulator (not shown) is connected through a flow meter 72 to an oxidizer inlet control valve 74, which in turn is corrected to the inlet 58 of plasma chamber 46. A second gas source such as a tank 76 containing an organosilicon is also provided. Tank 76 may be equipped with conventional pressure regulating devices and, where necessary to vaporize the particular organosilicon used, may be equipped with conventional heating and control devices (not shown). Tank 76 is connected through a reactant gas flowmeter 78 and a reactant gas inlet valve 80 to the upstream end 62 of conduit 60.

An electrode 80 which may optionally be in the form of a coil such as a helical resonator coil surrounds a portion of plasma chamber 46. Electrode 80 is electrically connected to a conventional RF matching network 82 which in turn is connected to an RF power source 84. Both of these devices are provided with appropriate controls and monitoring instruments for controlling the frequency and power of RF energy supplied to electrode 80.

In a process according to one embodiment of the invention, a hollow article such as a generally cylindrical bottle B is loaded into the interior space 40 of shell 32 so that the neck of the bottle is positioned within the end opening 37 of the shell and the axis of the bottle is aligned with the axis of shaft 24. The bottle is positioned in treatment chamber 10 so that the downstream end 56 of tube 54, and the downstream end 64 of conduit 60 protrude into the bottle through the neck opening of the bottle and extend generally axially within bottle B. Depending upon the configuration of the bottle and of the chamber loading devices, the bottle can be loaded into this position by first positioning the bottle within the shell while shaft 24 is retracted downwardly, towards the bottom of the shell and away from the downstream end of tube 54 and then operating linear actuator 30 to advance the shell and the bottle towards the tube until the tube protrudes into the shell and the bottle.

An oxidizing gas 70 is supplied from source 70 at a rate controlled by metering valves 74 and flow meter 72, whereas an organosilicon vapor is supplied from source 76 at a rate controlled by metering valve 80 and flow meter 78. The oxidizing gas most preferably is an oxygen-containing gas such as $O_2$, $N_2O$, $N_O$, air or mixtures of these. The organosilicon compound may include one or more organosilanes, organosiloxanes, or combinations thereof. Lower alkyl, alkoxy, aryl and vinyl silanes, and siloxanes and combinations thereof are preferred. Particularly preferred organosilicons include silanes and siloxanes having methyl, methoxy and vinyl functionalities. Other organosilicons which can be used include compounds having silyl and silazene functionalties. Specific compounds which can be used include methyl, dimethyl and trimethyl silanes; tetramethyl and hexamethyl disilanes and tetramethyl and hexamethyl disiloxanes. Hexamethyl disiloxane is particularly preferred. The term "vapor" is used herein to refer to the organosilicon compound in the gaseous state because these compounds usually are liquid at about room temperature or below, and are commonly handled as liquids. However, the term "vapor" should not be read as excluding compounds which are handled as gasses and remain gaseous throughout the process. The organosilicon compound should have a boiling temperature, at the subatmospheric pressures prevailing in the treatment chamber, below the degradation temperature of the compound. Also, the boiling temperature of the organosilicon should be less than the degradation temperature of the polymeric article to be treated.

Gasses passing into the chamber are continually removed through exhaust conduit 14 by vacuum pump 12. Controller 20 adjusts throttling valve 22 so as to maintain a controlled subatmospheric pressure in the interior of chamber 10 and hence also maintains the interior space 48 of plasma chamber 46 at a subatmospheric pressure. Desirably, the pressure within chamber 10 is about 0.01 to about 1.0 Torr, more preferably about 0.1 Torr. The flow rates of organosilicon vapor and oxidizing gas preferably are selected to provide a silicon to oxygen atomic ratio of about 1:30 to about 1:1 and preferably about 1:10 to about 1:1 in the gases passing into the treatment chamber.

RF power source 84 and matching network 82 are actuated to supply RF power to electrode 80. As oxidizing gas passes downstream from chamber inlet 58 towards tube 54, the oxidizing gas is subjected to electrical fields from the coil. The RF power level and frequency are selected so that these electrical fields substantially ionize the oxidizing gas within interior space 48 and convert the same into a plasma. As the plasma moves downstream, towards the downstream extension 52 of the chamber and adapter 50, the ions and free electrons of the plasma recombine to form electrically neutral but nonetheless high-energy, metastable active species such as free radicals. The composition of the species depends upon the composition of the oxidizing gas. For example, where the oxidizing gas includes $O_2$, the activated species may include monatomic oxygen and ozone. Where the oxidizing gas includes nitrogen as well as oxygen, the activated species derived from the plasma may also include NO. Activated species of this type are potent oxidizing agents, and are far more reactive than the normal, ground-state gases.

As conduit 60 extends through the plasma chamber, the organosilicon vapors passing through the conduit also pass within electrode 80. However, the organosilicon vapors are not substantially affected by electric fields from the electrode. Where electrode 80 is in the form of a coil, the conduit extends substantially coaxially with the coil. Therefore, the organosilicon vapors passing through the interior of the conduit pass substantially at the axis of the coil. The relatively small internal diameter of conduit 60 tends to suppress ionization and plasma formation even where electric fields are imposed. It is believed that this effect relates in part to suppression of secondary ionization. That is, because the conduit has such a small diameter, any electrically charged species which may form within the interior of the conduit can move only through relatively short paths, at least in the directions transverse to the axis. Such charged species therefore will not be accelerated to substantial velocities within the conduit and will not impact on substantial numbers of uncharged molecules in travelling between the walls of the conduit. Regardless of the reason for this effect, the organosilicon vapor is substantially unaltered as it passes through conduit 60.

The organosilicon vapors passing through the conduit flow through outlet orifice 66 at the downstream end of the conduit, whereas the activated species formed from the oxidizing gas plasma pass through the annular outlet orifice 55 at the downstream end 56 of tube 54. As best appreciated with reference to FIG. 2, the stream of activated species issuing from orifice 55 substantially surrounds the stream of organosilicon vapors issuing from orifice 66. The organosilicon vapors and activated species mix intimately with one another within the interior of bottle B, and react vigorously with one another. During this time, motor 28 continually rotates shaft 24 and hence shell 32 and bottle B about the common axis of the shaft, the bottle and tube 54, thus imparting a swirling motion to the mixed gases within the bottle and assuring substantially uniform distribution of these mixed, reacting gases about the circumference of the bottle. The mixed reacting gases flow generally axially, upwardly and outwardly through the neck of the bottle at the end opening 37 of the shell, and pass through the treatment chamber to the exhaust conduit 14. The reacting gases thus pass over the entire interior surface of the bottle. Optionally, linear actuator 30 can be operated to reciprocate shaft 24 and hence the shell and the bottle axially so as to more evenly distribute, fresh, incoming activated species and organosilicon vapors over the length of the bottle.

During this treatment, alternating potential power supply 42 is actuated to apply an alternating electrical potential to shaft 24 and hence to shell 32. As the mixed organosilicon vapors and active species are applied inside the bottle, and the electrical potential is applied to the shell on the outside of the bottle, the potential is applied to the reacting gases through the wall of the bottle. Desirably, the alternating electrical potential has a frequency between about 1 KHz and 100 MHz, and more preferably between about 100 KHz and 20 MHz. The peak to peak alternating potential preferably is between about 10 volts and about 5000 volts, whereas the alternating power input may be about 0.05 watts/cm$^2$ to about 10.0 watts/cm$^2$, and more preferably about 0.10 watts/cm$^2$ to about 5.0 watts/cm$^2$ of container surface area. This potential is sufficient to cause at least some ionization of the reacting gas and vapor species within the bottle. Here again, the present invention is not limited by any theory of operation. However, it is believed that the plasma within plasma chamber 48 serves as a virtual ground with respect to the alternating potential applied to the shell, and that this virtual ground is electrically coupled to the interior of the bottle through the activated species and possibly some ionic species passing downstream through tube 54. Regardless of the actual mode of operation, it is known that the electrical potential applied to the shell is in fact effectively applied through the wall of the bottle in much the same way as if an actual ground electrode were positioned within the interior of the bottle.

As the organosilicon vapors and activated species react with one another within the bottle, they form reaction products. Ordinarily, these reaction products include oxides of silicon such as $SiO_2$, SiO and mixed-valance oxides $SiO_x$. Where the oxidizing gases and/or the organosilicon vapors include nitrogen, the reaction product may also include some nitrides of silicon. The reaction products also incorporate some organic moieties derived from the organosilicon vapors. The reaction products are deposited on the interior surface of the bottle B. The deposited reaction products consist primarily of the oxides of silicon, although some of the organic moieties are also incorporated in the deposited reaction products. The depositing reaction products are influenced by the electrical potential applied through the bottle wall. In particular, the deposited reaction products are bombarded by electrically charged species, and particularly by electrons, from the ionized mixture within the bottle. The deposited reaction products form a substantially oxygen-impervious coating on the interior of the bottle.

The treatment desirably is continued for about 5 to about 300 seconds and more preferably between about 30 seconds and about 60 seconds. During this treatment time, the container is maintained at temperatures below the heat distortion or degradation temperature of the polymer constituting the container wall. Desirably, the container is maintained at below about 200° C., more desirably below about 100° C. and most desirably below about 60° C. Ordinarily, the container is at about room temperature (20° C.) or slightly above room temperature. Although the process gases, the electric fields or both may tend to heat the container somewhat, the thermal mass of the container ordinarily is sufficient to maintain the container at the desired temperatures during the treatment. After the treatment period, shell 32 is opened and the finished container is removed from the treatment chamber ready for use in the normal manner.

The deposited reaction products form a barrier coating, i.e., a coating having substantial resistance to permeation of gaseous or volatile materials. As used in this disclosure, the term "barrier coating" refers to a coating which has substantial resistance to permeation of at least one gas selected from the group consisting of oxygen, carbon dioxide and water vapor. The most preferred barrier coatings have substantial resistance to permeation of all of these substances, and also resist permeation of other substances such as hydrocarbons, flavorants and the like. As used in this disclosure, a coating can be considered to have "substantial" resistance to permeation of oxygen if the coating itself has a permeance of less than about 0.20 cc $O_2$/100 in$^2$—day-atm. The term "oxygen barrier coating" as used herein refers to a coating having such low oxygen permeance, regardless of whether or not the coating also has substantial resistance to permeation of other substances. More preferred oxygen barrier coatings have oxygen permeance of about 0.04 cc or less, even more preferably about 0.02 cc $O_2$/100 in$^2$ day-atm.

In similar fashion, a coating has "substantial" resistance to permeation of carbon dioxide if the carbon dioxide permeance of the coating itself is less than about 1.0 cc $CO_2$/100 in$^2$-day-atm. More preferred coatings have $CO_2$ permeance less than about 0.5 cc $CO_2$/100 in$^2$-day-atm. A coating has "substantial" resistance to permeation of water vapor if its water vapor permeance is less than about 0.4 gm $H_2O$/100 in$^2$-day-atm. More preferably, the coating has water vapor permeance of less than 0.04 gm $H_2O$/100 in$^2$-day-atm.

As the coatings typically are not self-supporting and cannot be tested unless the coating is present on a substrate, permeance of the coating typically is determined by measuring permeance of similar substrates with and without the coating, and correcting for any barrier effect of the substrate. The values set forth herein are for permeance as determined according to ASTM designation D3985 "Gas Transmission Rate Through Plastic Film Via a Coulometric Sensor" and ASTM designation F372 "Water Vapor Transmission Rate of Flexible Barrier Materials Via an Infrared Detection Method."

The preferred barrier coatings in accordance with the present invention will materially enhance the permeation resistance of common thermoplastic or other polymeric containers. The ability to form useful barrier coatings without materially heating the container is a particularly advantageous feature of preferred processes according to this aspect of the invention. It is surprising that the coatings applied according to the preferred processes are in fact barrier coatings, as these coatings are applied without substantial heating of the polymeric substrate. Coatings according to this aspect of the present invention may include appreciable amounts of organic residues. Thus, measurement of the coating composition by techniques suited to analysis of thin films, such as x-ray fluorescence spectroscopy and IR spectroscopy yield atomic percentages of up to about 5 percent carbon and typically between about 0.1 and about 1 percent carbon, with at least about 33 percent silicon and at least about 66 percent oxygen. Where the oxidizing gas includes nitrogen, the coatings typically contain trace amounts of nitrogen.

Ordinarily, the coatings are less than about 5000 angstroms thick, and typically between about 500 and about 2000 angstroms thick. The coatings typically adhere well to polymeric substrates when applied in accordance with the process discussed above. Preferred polymer substrates include thermoplastics such as polyethylene terephthalate, polyethylene, polypropylene, polystyrene and polyvinylchloride. Other substrates can also be used. The coatings are essentially inert with respect to all common chemicals and food ingredients and are transparent and optically clear. Because the coatings are disposed on the interior surfaces of the containers, they do not affect post-processing operations such as printing or application of adhesive labels to the containers. Moreover, the container wall serves to protect the coating from damage such as abrasion in shipping and handling. Also, because the barrier coating is disposed on the interior of the container, the barrier coating protects the contents of the container from absorption of oxygen or other gases dissolved in the wall of the container itself. The treatment process does not leave any appreciable amount of detectable or harmful chemical residues inside of the container.

The preferred coatings are essentially nonreactive with the polymer and constitute only a minute fraction of the mass of the container. Thus, the container can be recycled in the normal fashion. Where the container is melted in conventional recycling techniques such as extrusion, the inert coating serves as a minute amount of inert filler in the molten plastic.

Figures 3, 4:
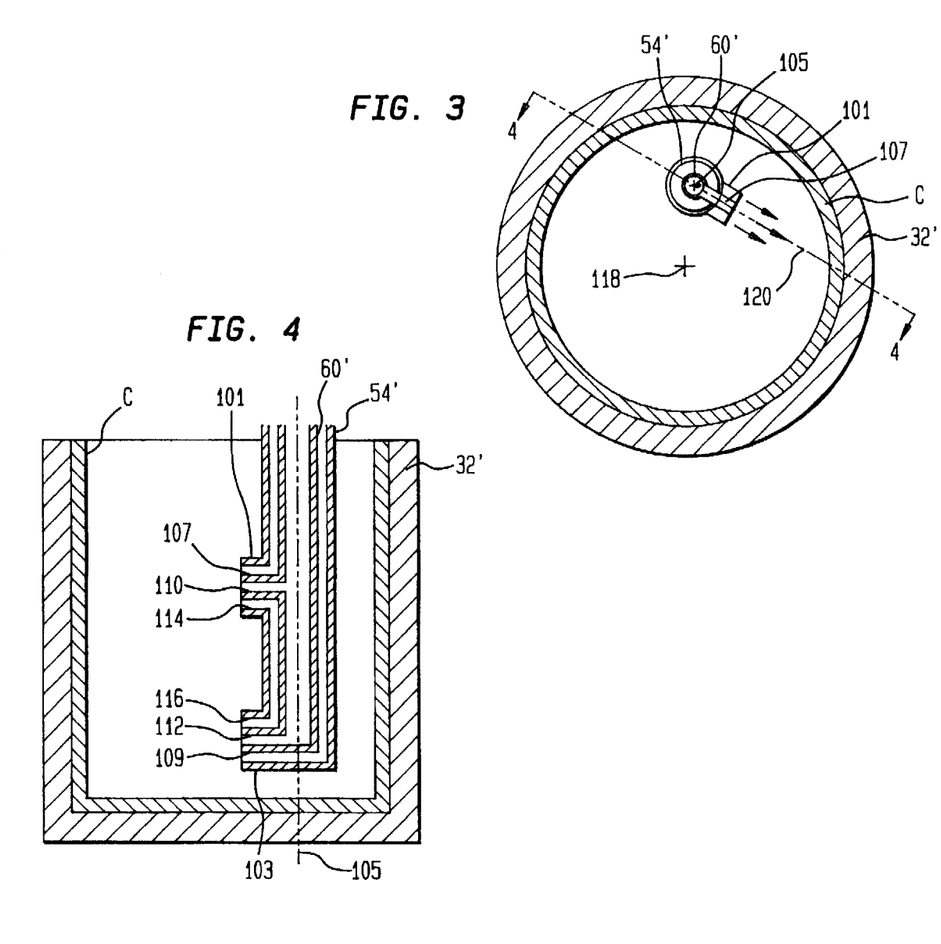
FIG. 3 is a fragmentary, sectional view depicting portions of apparatus according to a further embodiment of the invention.
FIG. 4 is a further fragmentary sectional view taken along line 4—4 in FIG. 3.

Portions of apparatus according to a further embodiment of the invention are illustrated in FIGS. 3 and 4. This apparatus includes an activated species or first gas outlet tube 54' communicating with the interior space of a plasma generation chamber (not shown). The downstream end of tube 54' is branched in a generally F-shaped configuration so that the two branches 101 and 103 extend generally perpendicularly to the axis 105 of the portion of tube 54' constituting the stem of the F. A conduit 60' extends within tube 54'. Conduit 60' is branched in a similar F-shape to form branches 107 and 109. These branches are disposed within the branches 101 and 103 of the tube. Branch 107 defines a gas outlet orifice 110 at its end remote from axis 105, whereas branch 109 defines a gas outlet orifice 112 at its end remote from access 105. The branches 101 and 103 of tube 54' define annular activated species outlet orifices 114 and 116 surrounding the gas outlet orifices 110 and 112 of the conduit.

The apparatus further includes a generally cup-shaped, wide-mouthed unitary shell 32' having an axis 118 remote from the axis 105. The orientation of the tube and conduit branches is such that the tube branches extend in directions generally transverse to the axis 118 of shell 32'. Thus, as seen in FIG. 3, the common axis 120 of branches 101 and 110 is substantially perpendicular to the axis 118 of shell 32' and axis 120 does not intersect axis 118. A generally cup-shaped hollow article C may be disposed within shell 32' so that the axis of the cup-shaped article is substantially coincident with shell axis 118.

Activated species may be supplied through tube 54' and organosilicon vapors through conduit 60' in substantially the same way as discussed above. Here again, the organosilicon vapor issuing through orifice 110 of conduit branch 107 will be surrounded by activated species issuing through annular orifice 114 of tube branch 101. As discussed above, the organosilicon vapor will mix intimately with the activated species issuing from the surrounding annular orifice. The same action will occur at orifices 112 and 116. As best seen with reference to FIG. 4, the activated species and organosilicon vapors will be discharged in directions generally transverse to the axis 118 of the container and remote from such axis. This serves to impart angular momentum about axis 118 to the mixed, reacting gases within container C and thus induces a rotary motion of the mixed gases and provides a swirling action. In this case, there is no need to rotate the container about its axis.

As will be readily appreciated, numerous variations and combinations of the features discussed above can be utilized without departing from the present invention as defined by the claims. For example, the internal configuration of shell 32 can be varied to fit different dimensions and geometry of the article to be treated. Also, hollow articles other than containers, and articles which are not hollow may be treated. Thus, articles such as polymeric films and sheets may be treated. Provisions can be made for removing heat from the container or other article during treatment. For example, the shield can be cooled by a circulating fluid such as a circulating liquid in channels formed within the shield but not communicating with the interior of treatment chamber 10. Shaft 24 may be provided with fluid passageways connected to a source of circulating fluid through an appropriate rotary fluid coupling, and the internal channels within the shaft may be linked to the internal channels of the shield. Linear actuator 30 may be omitted where reciprocation during treatment is not employed. Also, where satisfactory coating uniformity can be achieved without rotating the container, motor 28 can be omitted. The helical resonator coil 80 may be replaced by other types of electrodes in proximity to plasma chamber 46.

The process can also include a pre-treatment step. One useful pre-treatment is to introduce a pretreatment gas through the plasma chamber before the reaction-coating steps discussed above. This pretreatment gas may be converted to a plasma in the plasma chamber and the resulting activated species may be allowed to react with the interior surface of the container, without admixture of any organosilicon component. Alternatively, the pretreatment gas can be admitted to the interior of the container in its ground state, without preconversion to a plasma, and converted to a plasma by the alternating potential applied through the shell. Useful pre-treatment gases include oxidizing gases such as those discussed above, methane and noble gases such as He or Ar. In a further variant, the organosilicon can be applied as a pre-treatment gas so as to deposit an organic-enriched layer adjacent the polymeric substrate. The oxidizing gas flow can be started gradually or suddenly after this step. This type of treatment is particularly useful in promoting adhesion of the coating to polypropylene and similar substrates. In the pre-treatment step, the alternating potential may be varied from that used in the process discussed above so as to provide a greater degree of ionization of the gases within the container and thus provide a stronger plasma treatment. Alternatively, the alternating voltage may be omitted during this phase of the process so that the interior surface of the container is only treated by the activated species without influence of an electric field.

A post-treatment step may be utilized to treat the coating formed as discussed above with essentially any desired gas composition. For example, an inert gas plasma may be used to provide electron bombardment without substantial chemical treatment, whereas an oxidizing post-treatment gas may be used to volatilize and remove a greater proportion of the organic residues. Conversely, an organic post-treatment gas may be employed to provide an organic overcoat atop the coating on the interior wall of the container. The power to the plasma chamber electrode, or to the shell 32 can be varied during the process so as to vary the deposition rate and control the coating morphology. Generally, it has been found that increasing the power applied to bias the shell at a given frequency, results in a barrier coating having a lower water vapor permeance rate. DC or RF potential can be used instead of the audio frequency potential discussed above.

Where the hollow article to be treated includes plural openings, the conduits or tubes used to convey the activated species and organosilicon into the hollow article may extend through separate openings.

As can be appreciated from FIGS. 1 and 2, the relative position of downstream end 64 of conduit 60 and downstream end 56 of tube 54 can be varied to affect the location of the initial reaction between the organosilicon vapor and the activated species, without departing from the scope of the present method and apparatus for depositing barrier coating. Thus, the properties of the coating deposited on a given substrate can be varied by varying the distance between outlet orifice 66 and annular outlet orifice 55. Where outlet orifice 66 is disposed within tube 54 upstream from annular outlet orifice 54, the activated species and the organosilicon will react to some extent prior to entering bottle B through annular outlet orifice 55. One way to vary the relative position of the outlet orifices is to include a slidable connection (not shown) between conduit 60 and tube 54 to permit axial adjustment with respect to each other.

As these and other variations and combinations of the features discussed above can be utilized without departing from the present invention, the foregoing description of the preferred embodiments should be taken by way of illustration rather than by way of limitation of the present invention as defined by the claims. The following examples are intended to further illustrate the invention, but not to limit it.

EXAMPLE 1

Bottles with a 16 ounce nominal volume formed from polyethylene terphtalate (PET) by blow molding have an oxygen permeance of 0.0135 cc [STP] $O_2$/container-day-atm prior to treatment. The containers are treated with apparatus generally in accordance with FIGS. 1 and 2.

Nitrous oxide supplied at the rate of 40 standard cubic centimeters per minute (sccm) is activated using a 2-inch diameter helical resonator coil with an applied radio frequency energy of 60 watts at 13.56 MHz. Hexmethyldisiloxane is supplied at a rate of 4.1 sccm. A pressure of about 0.110 Torr is maintained within the treatment chamber and 80 watts of 450 KHz audio frequency energy is applied to the shell. The bottle is rotated at 10 rotations per minute.

Treatment for 2 minutes under these conditions deposits a barrier coating onto the inside surface of the bottle which reduces the oxygen permeance to 0.0060 cc $O_2$/container-day-atm.

EXAMPLE 2

The barrier properties of 1.0 mil PET packaging film are improved by treating the film using a modification to the preferred apparatus described above. Conical adapter 50 and tube 54 are eliminated and conduit 60 is shortened such that it discharges organosilicon proximate to the downstream extension 52 of chamber 46. Shell 32 and shaft 24 are replaced with a flat electrical bias plate positioned approximately 4 inches from and generally perpendicular to conduit 60.

Nitrous oxide supplied at the rate of 40 sccm is activated using a 2-inch diameter helical resonator coil with an applied radio frequency energy of 200 watts at 13.56 MHz. Hexamethyldisiloxane is supplied at a rate of 4.1 sccm. A pressure of about 0.180 Torr is maintained within the treatment chamber and 100 watts of 450 KHz audio frequency energy is applied to the flat bias plate containing the PET film sample.

Treatment for 6 minutes under these conditions deposits a barrier coating onto the film which reduces the oxygen permeance from 4.2 cc $O_2$/100 in$^2$-day-atm to 0.02 cc $O_2$/100 in$^2$-day-atm. The water vapor permeance is reduced from 1.3 grams/100 in$^2$-day-atm to 0.02 grams/100 in$^2$-day-atm. The carbon dioxide permeance is reduced from 19.1 cc/100 in$^2$-day-atm to 0.2 cc/100 in$^2$-day-atm.

EXAMPLE 3

The barrier properties of a polymeric container can also be improved by depositing a coating onto the outside surface of the container using a modification to the preferred embodiment. The flat bias plate described in Example 2 is eliminated and a 16 ounce PET bottle electrically biased from the inside is rotated under the discharge of conduit 60 and the downstream extension 52 of chamber 46.

Nitrous oxide supplied at the rate of 40 sccm is activated using a 2-inch diameter helical resonator coil with an applied radio frequency energy of 200 watts at 13.56 MHz. Hexathyldisiloxane is supplied at a rate of 4.1 sccm. A pressure of about 0.140 Torr is maintained within the treatment chamber end 100 watts of 450 KHz audio frequency energy is applied as a bias to the inside of the bottle.

Treatment for 3 minutes under these conditions deposits a barrier coating onto the outside surface of the bottle which reduces the oxygen permeance from 0.0135 cc $O_2$/container-day-atm to 0.0045 cc $O_2$/container-day-atm.

Bottles with a 32 ounce nominal volume formed from polypropylene by blow molding have an oxygen permeance of 0.045 cc $O_2$/container-day-atm prior to treatment. Treatment for 8 minutes using the conditions in Example 3 deposits a barrier coating onto the outside surface of the bottle which reduces the oxygen permeance to 0.07 cc $O_2$/container-day-atm.

Bottles with a 32 ounce nominal volume formed from polyethylene terephthalate by blow molding have an oxygen permeance of 0.045 cc $O_2$/container-day-atm prior to treatment.

Oxygen supplied at the rate of 200 sccm is activated using a 2-inch diameter helical resonator coil with an applied radio frequency energy of 105 watts at 13.56 MHz. Hexamethyldisiloxane is supplied at a rate of 10 sccm. A pressure of about 0.250 torr is maintained within the treatment chamber and 125 watts of 250 KHz audio frequency energy is applied as a bias to the inside of the bottle.

Treatment for 5 minutes under these conditions deposits a barrier coating onto the outside surface of the bottle which reduces the oxygen permeance to 0.006cc $O_2$/container-day-atm. The water vapor permeance is reduced from 0.024 grams/container-day-atm to 0.010 grams/container-day-atm.

The oxygen permeance values for the five examples are summarized below:

| Example | Geometry | Material | Size | Surface | Untreated Oxygen Permeance | Treated Oxygen Permeance |
|---|---|---|---|---|---|---|
| 1 | Bottle | PET | 16 oz | Inside | 0.0135 | 0.0060 |
| 2 | Film | PET | 1 mil | One side | 4.2 | 0.02 |
| 3 | Bottle | PET | 16 oz | Outside | 0.0135 | 0.0045 |
| 4 | Bottle | PP | 32 oz | Outside | 0.58 | 0.07 |
| 5 | Bottle | PET | 32 oz | Outside | 0.045 | 0.006 | cc $O_2$/container-day-atm for bottles
cc $O_2$/100 in $^2$day-atm for film

What is claimed is:

1. Gas supply apparatus comprising:
   (a) a plasma chamber defining an interior space;
   (b) first gas inlet means for supplying a first gas to the interior space of said chamber;

(c) plasma conversion means for converting said first gas to a plasma in said interior space so as to form plasma-activated species;

(d) second gas supply means for supplying a second gas reactive with said active species; and (e) means defining an activated species outlet orifice communicating with said plasma chamber, and a second gas outlet orifice connected to said second gas supply means, one of said outlet orifices surrounding the other one of said outlet orifices whereby said second gas and said activated species will be discharged from said outlet orifices as streams and one of said streams will surround the other one of said streams.

2. Apparatus as claimed in claim 1 wherein said activated species outlet orifice surrounds said second gas outlet orifice.

3. Apparatus as claimed in claim 1 further comprising adjustment means for adjusting the relative location of said second gas outlet orifice conduit with respect to said activated species outlet orifice.

4. Apparatus for treating a hollow article comprising:

(a) a treatment chamber;

(b) means for retaining a hollow article at a treatment location within said treatment chamber;

(c) means for converting a first gas to a plasma at a plasma zone remote from said treatment location so that said plasma forms activated species;

(d) means for delivering said activated species to the interior of the hollow article; and (e) means for delivering a second gas reactive with said activated species to the interior of said article separately from said activated species but simultaneously therewith so that said second gas mixes with said activated species within said article, whereby the interior of the article is exposed to the products of reaction between said second gas and said activated species.

5. Apparatus as claimed in claim 4, wherein said means for retaining a hollow article includes an electrically conductive shell adapted to envelop the exterior of the article, the apparatus further comprising means for applying an electrical potential to said shell.

* * * * *

UNITED STATES PATENT AND TRADEMARK OFFICE
CERTIFICATE OF CORRECTION

PATENT NO. : 5,704,983

DATED : January 6, 1998

INVENTOR(S) : Thomas et al.

It is certified that error appears in the above-identified patent and that said Letters Patent is hereby corrected as shown below:

Column 6, line 14, "Just" should read --just--.

Column 6, line 42, "some" should read --same--.

Column 6, line 59, "corrected" should read --connected--.

Column 6, line 66, "80" should read --79--.

Column 7, line 30, "$N_O$" should read --NO--.

Column 7, lines 37, 38, "function-alties" should read --functionalities--.

Column 7, line 61, "Tort." should read --Torr.--.

UNITED STATES PATENT AND TRADEMARK OFFICE
CERTIFICATE OF CORRECTION

PATENT NO. : 5,704,983
DATED : January 6, 1998
INVENTOR(S) : Thomas et al.

It is certified that error appears in the above-identified patent and that said Letters Patent is hereby corrected as shown below:

Column 9, line 34, "moleties" should read --moieties--.

Column 14, line 19, "end" should read --and--.

Column 14, lines 31, 32,

"$O_2$/ container-day-atm.
　　　Bottles with a 32 ounce nominal volume formed from"

should read

--$O_2$/ container-day-atm.

EXAMPLE 5

Bottles with a 32 ounce nominal volume formed from--

Signed and Sealed this

Twenty-sixth Day of May, 1998

Attest:

BRUCE LEHMAN

*Attesting Officer*　　　*Commissioner of Patents and Trademarks*